United States Patent [19]

Tarbutton et al.

[11] Patent Number: 4,617,522

[45] Date of Patent: Oct. 14, 1986

[54] TEMPERATURE REGULATED FEEDFORWARD AMPLIFIER

[75] Inventors: Victor F. Tarbutton; J. Edwin Mitchell; Robert M. Blumenkranz, all of Brea, Calif.

[73] Assignee: General Instrument Corporation, New York, N.Y.

[21] Appl. No.: 591,438

[22] Filed: Mar. 20, 1984

[51] Int. Cl.[4] .............................................. H03F 1/30
[52] U.S. Cl. ................................... 330/149; 330/151; 330/289; 330/297
[58] Field of Search ................ 330/149, 151, 289, 297, 330/298, 207 P

[56] References Cited

U.S. PATENT DOCUMENTS

| | | | |
|---|---|---|---|
| 4,011,518 | 3/1977 | Irvine et al. | 330/289 |
| 4,122,400 | 10/1978 | Mendendorp et al. | 330/298 X |
| 4,131,860 | 12/1978 | Fyot | 330/298 X |
| 4,158,180 | 6/1979 | Challen | 330/298 |
| 4,258,328 | 3/1981 | Prevot et al. | 330/151 X |
| 4,438,411 | 3/1984 | Rubin et al. | 330/289 |

OTHER PUBLICATIONS

Blumenkranz, "A Microprocessor Monitored Feed-Forward Super Trunk CATV Amplifier", *IEEE Transactions on Cable Television,* vol. CATV-5, No. 3, Jul. 1980, pp. 105–116.

*Primary Examiner*—James B. Mullins
*Attorney, Agent, or Firm*—Spensley Horn Jubas & Lubitz

[57] ABSTRACT

A temperature regulated feed forward amplifier for use in broad bandwidth cable communications applications, includes an IC amplifier, a fixed voltage power supply for the IC amplifier, temperature sensing circuitry for detecting temperature variations from a preselected reference temperature and regulating the voltage from the fixed voltage power supply to maintain the gain and resultant phase of the amplifier relatively uniform over the bandwidth and over a range of temperatures.

14 Claims, 2 Drawing Figures

TEMPERATURE REGULATED FEEDFORWARD AMPLIFIER

FIELD OF THE INVENTION

This invention pertains to broad bandwidth feedforward amplifiers and, in particular, feedforward amplifiers incorporating temperature regulating circuitry.

BACKGROUND OF THE INVENTION

Feedforward amplifiers provide a means of amplifying signals with a minimum of distortion. They are particularly useful in cable communication systems of an extended length where repeated amplifications are necessary to maintain signal quality.

In various cable communication systems, for example cable television networks, signal strength and quality must be maintained over long distances. Such systems maintain the signal at the desired level by use of a series of amplifiers positioned along the cable. Some cable communication systems are currently being designed to carry broad bandwidth signals, e.g. 50 MHz to 550 MHz plus frequencies.

Maintaining signal quality in a long distance, broad bandwidth cable communication system represents a difficult technological challenge. The strength of the original signal will decrease generally in proportion to the length of the cable over which the signal is transmitted, and must be periodically restored by amplifiers distributed along the cable. Distortion may be introduced at the various amplification stages by a wide variety of causes, e.g. inherent bandwidth limitations of the amplifier, variations in the signal carrying properties of the cable, external signals, temperature variations and other environmental effects. Since introduction of appreciable distortion at each amplification stage would result in unacceptable signal quality after repeated amplifications, minimumization of distortion at each amplification stage is critical.

Feedforward amplifiers reduce such distortion by combining the unamplified, incoming signal with the amplified signal, suitably attenuated, to obtain a signal component representative of the distortion, phase inverting and amplifying that component, and then recombining the phase inverted distortion component with the amplified signal. The phase inverted distortion component thus cancels the distortion component in the amplified signal, leaving the amplified signal relatively free of distortion. The operation of a feedforward amplifier of the type considered in the preferred embodiment of the present invention is described in U.S. Pat. No. 4,472,725 for LC Delay Line for Feedforward Amplifier, to Robert M. Blumenkranz.

To obtain the distortion component, the amplified signal (with its inherent distortion) is first attenuated then combined with the original, or incoming, signal, suitably delayed. The delay must be adjusted to achieve complete cancellation of the (attenuated) amplified signal by the incoming signal, thereby allowing complete cancellation of the distortion component of the amplified signal and the phase inverted distortion component. Due to the necessity of exact cancellation of the distortion component and phase inverted distortion component, any change in the phase or relative strengths of the signals introduced by the feedforward circuitry or by external factors can substantially increase the distortion in the output signal. One cause of such a change is a change in the ambient temperature of the feedforward amplifier. Temperature induced changes in gain of the IC amplifiers employed in such feedforward circuitry, and corresponding changes in phase of the amplified signals, are particularly significant in a cable communication systems where wide variations in ambient temperature may be experienced and the IC amplifiers must operate over a very broad bandwidth in a system that cannot tolerate cumulative distortionn effects.

It is an object of the present invention to provide a feedforward amplifier which maintains relatively distortion free amplification over a wide temperature range and broad bandwidth. This and other objects of the present invention will be apparent to those skilled in the art.

SUMMARY OF THE INVENTION

The above and other objects are achieved by providing means for regulating the power supplied to one or more of the integrated circuit amplifiers incorporated in a feedforward amplifier in response to changes in the ambient temperature to maintain the gain and phase of the IC amplifier relatively uniform over the bandwidth and over a range of temperatures. In a preferred embodiment, the regulating circuitry is connected in series with the integrated circuit error amplifier and its power supply. The temperature sensing and regulating capability of said circuitry is provided by one or more transistors connected by amplification circuitry to a thermistor for temperature sensing and response. The particular configuration of transistors and resistors in the regulating circuitry preferably are determined by particular characteristics of the integrated circuit amplifier being employed in the feedforward amplifier.

DESCRIPTION OF THE PREFERRED EMBODIMENT

Figure 1:
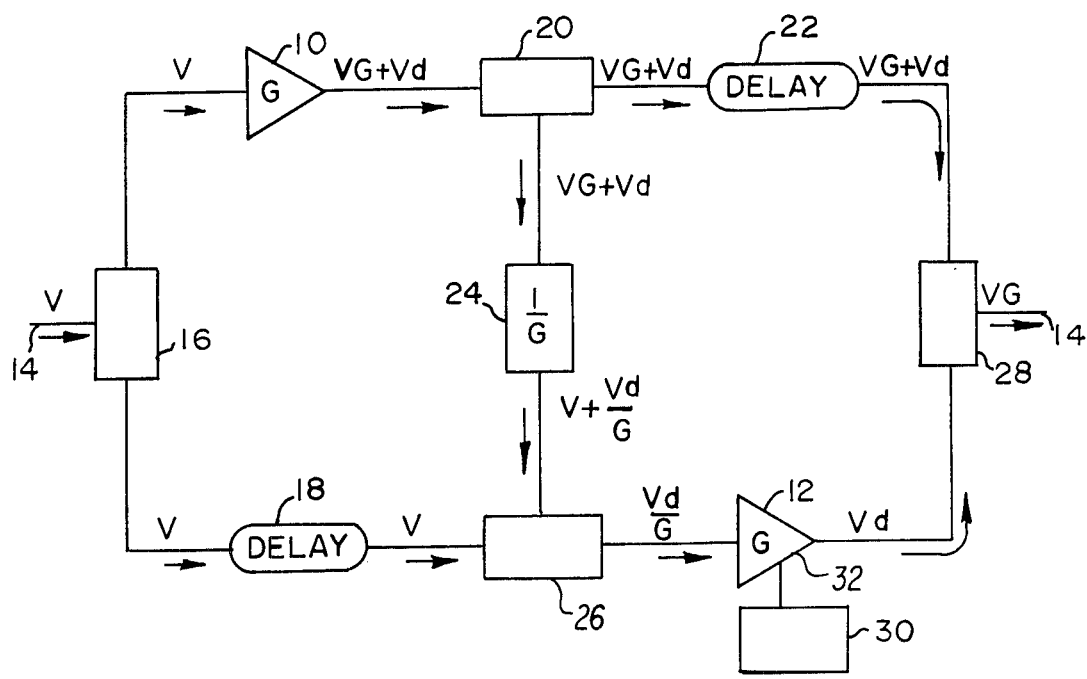
FIG. 1 is a block diagram of a feedforward amplifier incorporating a temperature regulated power supply constructed in accordance with a preferred embodiment of the present invention.

To provide a framework for understanding the invention, FIG. 1 presents a block diagram of an ideal (lossless) feedforward amplifier. It includes a main amplifier 10 and an error amplifier 12. The original, or incoming, signal "V" which is to be amplified, is coupled from cable 14 to first directional coupler 16 which splits the signal into two portions, one of which is delivered to the input terminal of main amplifier 10 and the other of which is delivered to first delay means 18. The amplified signal appearing at the output terminal of main amplifier 10 has the form "$VG + V_d$", where "G" represents the gain of main amplifier 10 and "$V_d$" represents the signal distortion inherently introduced by the amplification process. Ideally, the distortion component $V_d$ is to be eliminated to yield a "pure" amplified signal "VG".

The amplified signal "$VG + V_d$", is applied to second directional coupler 20 which splits the amplified signal into two portions, one of which is directed to second delay means 22 and the other of which is directed to attenuator 24. Attenuator 24 is adjusted to attenuate signals passing therethrough by an amount which is inversely proportional to the gain "G" of main amplifier 10. Accordingly, the signal appearing at the output terminal of attenuator 24 has the form "V+$V_d$/G". This attenuated signal portion is coupled to third directional coupler 26 which combines it with the non-amplified signal portion passed through first delay means 18.

First delay means 18 is included to ensure that the non-amplified signal portion applied through it to the third directional coupler 26 will be precisely 180 degrees out of phase with the attenuated signal portion passed to third directional coupler 26 by attenuator 24. If these signals are not precisely 180 degrees out of phase then undesireable distortion results when they are combined.

Because the attenuated signal portion is 180 degrees out of phase with respect to the non-amplified signal portion, signals in the two portions representative of the input signal "V" cancel one another, so that the signal leaving third directional coupler 26 has the form "$V_d$/G".

Ideally, the gain of error amplifier 12 is equal to the gain "G" of main amplifier 10. Thus, a signal representative of the distortion component "$V_d$" introduced by main amplifier 10 appears at the output terminal of error amplifier 12.

Second delay means 22 delays the amplified signal "VG+$V_d$" before presenting it to a fourth directional coupler 28 so that it is precisely 180 degrees out of phase with the error amplifier output signal, which is also presented to the fourth directional coupler 28. Accordingly, when the error amplifier output signal is combined by fourth directional coupler 28 with the output signal from second delay means 22, signal components representative of the distortion "$V_d$" introduced by main amplifier 10 precisely cancel one another, leaving a "pure" amplified signal "VG" for passage along cable 14.

In the real world, ideal feedforward amplifier characteristics can only be approximated. Each component of the feedforward amplifier must be designed to achieve the aforementioned operating characteristics as closely as possible. For example, the delay means must meet two objectives. First, each of the delay means 18 and 22 must delay broad bandwidth signals passing therethrough for a precise time interval, uniform across the bandwidth, so that separate signals reaching either of combining couplers 26 or 28 are precisely 180 degrees out of phase with each other. Otherwise, undesirable distortion results. Second, each of the delay means 18 and 22 must be carefully impedance matched with the other amplifier circuit components to avoid undesirable signal attenuation or reflection caused by impedance mismatching. These objectives must be met over the entire operating bandwidth of the feedforward amplifier.

First and second delay means 18 and 22 may be tuned to approximate reasonably closely the above-noted two objectives for a given circuit and a specific temperature. Commercially available integrated circuit amplifiers, such as are suitable for use as the main amplifier 10 and error amplifier 12, exhibit distortion and significant variations in gain as the ambient temperature of the amplifier varies. In particular, when broad bandwidth amplification is necessary, for example a 50 Mhz to 550 MHz frequency range, appreciable temperature dependence of the gain will be encountered through portions of the bandwidth. For integrated circuit amplifiers tested, the temperature variation will typically be most pronounced in the higher portion of the bandwidth, for example corresponding to frequencies above 300 MHz. It has been found that these temperature dependent effects are more significant in the error amplifier 12 than in the main amplifier 10, presumably because small changes in the error signal phase and gain will produce large changes in the effective distortion cancellation.

The temperature dependent variations in gain of commerical IC amplifiers introduce corresponding variations in the phase of the amplified signal. These variations in phase prevent the feedforward circuit from exactly cancelling the distortion component with the phase inverted distortion component. This results in a corresponding degradation in signal quality.

Although the phase variations resulting from temperature changes are a result of changes in gain of the IC amplifier, compensation of this effect would not be expected to be achievable by a compensating change in the gain of the IC by regulating the power supply to the IC amplifier. That is, while the temperature induced gain changes and resulting distortion are nonuniform over the bandwidth, the regulating of the gain by virtue of the power supply would in contrast be expected to produce a gain change uniform through the operating bandwidth. Nonetheless, it has been found that for specific IC amplifiers tested the fluctuation in the gain of the IC amplifier can be effectively compensated for by regulating the voltage level of the power supply to the amplifier in response to temperature changes. It is conjectured that this is due to the enhanced feedback properties of certain IC amplifiers at lower frequencies, with correspondingly greater gain responsiveness, both to changes in temperature and change in power supply, at higher frequencies. Therefore, a significant improvement in performance of the feedforward amplifier has been achieved by providing a temperature responsive voltage regulating circuit connected to one or more of the IC amplifiers, preferably the error amplifier 12.

In FIG. 1, a temperature responsive voltage regulator 30 is shown connected in series with the power input 32 of the error amplifier 12 and the power supply. A similar circuit may be connected to the main amplifier 10, or in an alternate embodiment, to both the error amplifier 12 and main amplifier 10.

Figure 2:
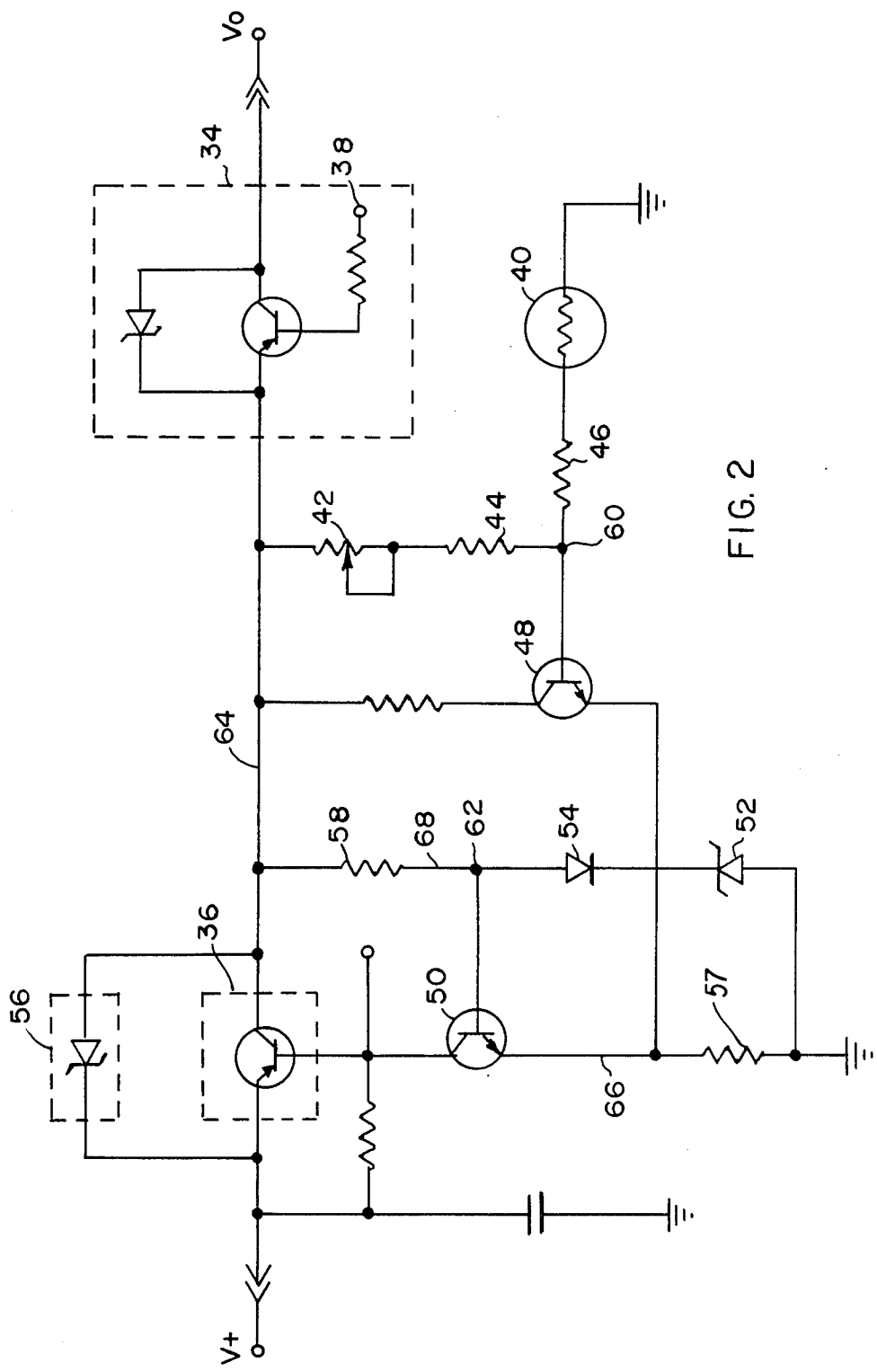
FIG. 2 is a schematic diagram of a preferred embodiment of a temperature regulating circuit.

A preferred embodiment of the temperature responsive voltage regulator circuit 30 is illustrated in FIG. 2. The circuit 30 employs an amplitude modulator 34 in series with a series pass bipolar transistor 36. Connected to the series pass transistor 36 and amplitude modulator 34 is temperature sensing circuitry and amplifying circuitry described in more detail below.

The amplitude modulator 34 is utilized to detect malfunctioning IC amplifiers in the field by inserting a modulated signal at the input 38 and monitoring the feedforward amplifier output for a corresponding side band. The circuit configuration for the modulator 34 is the same as shown in U.S. Pat. No. 4,472,725 and will not be described here. The amplitude modulator 34 is included as part of the temperature regulator 30 to allow a more compact configuration.

The series pass transistor 36 regulates the voltage supplied to the error amplifier 12 in response to variations in the base drive supplied to it by the associated amplification circuitry. This amplification circuitry in turn is responsive to temperature sensing circuitry. In the preferred embodiment the temperature sensing circuitry includes thermistor 40 and resistors 42, 44 and 46. Variations in the resistance of the thermistor 40 in response to changes in ambient temperature effect corresponding changes in the voltage drop across the thermistor 40. Resistors 42, 44 and 46 are needed to adjust the overall resistance of the temperature sensing circuitry to give appropriate variations in voltage in response to variations in temperature.

The amplification circuitry includes two bipolar transistors 48 and 50, diodes 52 and 54, and resistors 56 and 58. This circuitry acts effectively as an emitter-coupled differential amplifier modifying the base drive to the series pass transistor 36 in response to the voltage difference between the voltages at point 60 and point 62.

The voltage in line 64 produces a voltage drop across series connected thermistor 40 and resistors 42, 44 and 46 and produces a voltage at point 60. As ambient temperature changes, the resistance of thermistor 40 changes proportionately, producing a corresponding change in voltage at point 60. The voltage at point 60 is applied to the base of transistor 48 thereby controlling the voltage appearing on line 66. The voltage on line 68 is maintained relatively constant by the voltage stabilizing effect of zener diode 52. Thus the varying voltage on line 66 will result in a corresponding varying voltage on the base of transistor 36, thereby adjusting the power applied to error amplifier 12 in response to temperature changes.

The preferred embodiment of the present invention in a cable communication application, using a currently available IC amplifier such as Motorola model SHW 1881 and later generations, will regulate the voltage input to the IC error amplifier in response to temperature variations between a minimum of approximately 20 volts and a maximum of approximately 25 volts. The low end of the range is set by the source voltage V+ and the zener diode shunt 56 across the series pass transistor 36. The upper end is determined by the circuitry affecting the base drive to the series pass transistor 36.

Operating voltage $V_o$ is set at approximately 22.5 volts at a specific temperature, e.g. room temperature. The variation between the minimum and maximum voltage is regulated by the base drive to the series pass transistor 36 as determined by thermistor 40 and the differential amplifier formed by the transistors 48 and 50, diodes 52 and 54, resistors 57 and 58 and the connecting circuitry. Additional tuning may be achieved after the general circuit characteristics are established by altering the variable resistance 42.

In general the selection of the basic source voltage V+ and the voltage range resulting from temperature variations as sensed by the thermistor 42, is selected from a consideration of the particular application and the specifications and operating characteristics of the specific IC error amplifier utilized in the feedforward amplifier. These parameters will therefore vary in alternate embodiments corresponding to different applications and different integrated circuit amplifier characteristics. For example, a cable communication system requiring relatively moderate signal gain at each amplification stage may only require a voltage variation of less than 5 volts to adequately compensate for temperature effects.

It will be apparent to one skilled in the art that a wide variety of modifications of the disclosed circuitry may be made without departing from the spirit or scope of the present invention. In particular, variations are possible in the coupling of the temperature sensitive means, thermistor 40 of the preferred embodiment, with the power varying means, series pass transistor 36 of the preferred embodiment. In addition, the bipolar transistors utilized in the circuitry of the preferred embodiment may be replaced by equivalents, such as CMOS transistors, with corresponding changes in the circuit configuration.

Other alternate embodiments and modifications will also be apparent to those skilled in the art. Accordingly, the scope of the present invention is to be construed in accordance with the following claims.

What is claimed is:

1. In a feedforward amplifier having at least a main amplifier producing a first output signal; an error amplifier producing a second output signal; first and second delay means; a first directional coupler splitting an input RF signal and directing portions of the signal to the input of the main amplifier and to the input of the first delay means; a second directional coupler splitting the first output signal and directing portions of the first output signal to the input of the second delay means and to a third directional coupler; the third directional coupler combining the portion of the first output signal received from the second directional coupler with an output signal from the first delay means and directing the combined signals to the input of the error amplifier; and a fourth directional coupler combining an output signal from the second delay means with the second output signal and directing the combined signals to an output port; the improvement comprising:

temperature responsive means connected to the feedforward amplifier for modifying the gain of at least one of said amplifiers to compensate for gain changes induced by changes in ambient temperature without employing feedback from the output of the amplifier, thereby maintaining the gain of the amplifier relatively uniform over the bandwidth of the input signal and over a wide range of temperatures.

2. A feedforward amplifier as set forth in claim 1, wherein the temperature responsive means comprises temperature sensing means for producing a temperature responsive signal, power varying means for varying the voltage applied to said at least one amplifier in response to said input signal, and circuit means for providing an input signal proportional to the temperature responsive signal to the power varying means.

3. A feedforward amplifier as set forth in claim 2, wherein the temperature sensing means comprises a thermistor, the power varying means comprises at least one semiconductive element, and the circuit means comprises amplifier means for amplifying the temperature responsive signal.

4. A feedforward amplifier as set forth in claim 3, further comprising amplitude modulator means, connected in series with the temperature responsive means and the power input of said at least one amplifier, for receiving an externally provided test signal.

5. A feedforward amplifier as set forth in claim 2, wherein the temperature sensing means comprises a thermistor, the power varying means comprises a first transistor, and the circuit means comprises differential amplifier means for altering the base drive to the first transistor in response to changes in the resistance of the thermistor.

6. A feedforward amplifier as set forth in claim 5, wherein the power varying means further comprises zener diode means for shunting the transistor and the differential amplifier means comprises a second and third transistor coupled with common emitter.

7. In a feedforward amplifier circuit having main amplifier means for receiving a broad bandwidth input signal and amplifying said input signal to provide an amplified signal said amplified signal having a distortion component, error signal means responsive to the amplified signal provided by said main amplifier means for producing an attenuated error signal proportional to said distortion component and of inverted phase relative to said distortion component, error amplifier means for amplifying said attenuated error signal to provide an error signal, and means for combining said error signal and said amplified signal to cancel said distortion component, the improvement comprising:

a temperature dependent gain modifying circuit for use with said error amplifier means comprising:

temperature sensing means for producing a temperature responsive signal responsive to changes in ambient temperature;

differential amplifier means responsive to the temperature responsive signal for producing an amplified temperature responsive signal; and regulating means responsive to the amplified temperature responsive signal for regulating the power supply to the error amplifier means so as to compensate for phase variations and gain variations in said error signal in response to changes in ambient temperature.

8. A circuit as set forth in claim 7, wherein the differential amplifier means comprises first and second transistor means, and the regulating means comprises a series pass transistor shunted by a zener diode.

9. A circuit as set forth in claim 8, wherein the differential amplifier means further comprises zener diode means for establishing a reference voltage for comparison with the voltage across the temperature sensing means.

10. In a feedforward amplifier circuit having main amplifier means for receiving a broad bandwidth input signal and amplifying said input signal to provide an amplified signal said amplified signal having a distortion component, error signal means responsive to the amplified signal provided by said main amplifier means for providing an attenuated error signal proportional to said distortion component and of inverted phase relative to said distortion component, error amplifier means for amplifying said attenuated error signal to provide an error signal and means for combining said error signal and said amplified signal to substantially cancel said distortion component, the improvement comprising:

a temperature regulated power supply for said error amplifier means, said error amplifier means having empirically predetermined gain and phase variation characteristics in relation to temperature, comprising:

a constant voltage power source;

a transistor in series with the constant voltage power source;

temperature dependent means for modifying the base drive to the transistor in response to temperature changes in accordance with a predetermined relationship derived from said phase and gain variation characteristics.

11. The circuit of claim 10 wherein the temperature dependent means comprises a thermistor and a first and second semiconductive element responsive to the voltage drop across the thermistor.

12. A broad bandwidth, open loop temperature stabilized feedforward amplifier for use in cable communications systems requiring repeated amplification stages including:

means for receiving a broad bandwidth signal;

main amplifier means electrically attached to the receiving means for amplifying the broad bandwidth signal with uniform gain over the bandwidth and a given temperature to provide an amplified signal, said amplified signal having a distortion component;

error signal means, coupled to said means for receiving and said main amplifier means, for providing an attenuated error signal proportional to said distortion component but having attenuated magnitude and inverted phase relative to said distortion component;

error amplifier means electrically coupled to said error signal means for amplifying the attenuated error signal with uniform gain over the bandwidth at a given temperature;

a power supply electrically connected to and supplying power to the error amplifier means; and means for regulating the output power of the power supply in response to changes in the ambient temperature to maintain the gain of the error amplifier means relatively uniform over the bandwidth and over a range of temperatures.

13. A broad bandwidth, gain stabilized amplifier as set forth in claim 12 wherein the regulating means includes:

temperature sensitive means for providing a signal responsive to changes in ambient temperature;

amplifier means for amplifying the temperature responsive signal to produce an amplified temperature responsive signal; and semiconductor means connected in series with the amplifier means and the power supply for modifying the power supply to the amplifier means in response to variations in the amplified temperature responsive signal.

14. A broad bandwidth, gain stabilized amplifier as set forth in claim 13 wherein the amplifier means includes a first transistor and second transistor coupled with common emitter and a zener diode coupled to the semiconductor means and the base of the second transistor, and the temperature sensitive means includes a thermistor coupled to the semiconductor means and the base of the first transistor.

* * * * *